United States Patent
Burak et al.

(10) Patent No.: US 9,099,983 B2
(45) Date of Patent: Aug. 4, 2015

(54) BULK ACOUSTIC WAVE RESONATOR DEVICE COMPRISING A BRIDGE IN AN ACOUSTIC REFLECTOR

(71) Applicant: Avago Technologies General IP (Singapore) Pte. Ltd., Singapore (SG)

(72) Inventors: Dariusz Burak, Fort Collins, CO (US); John Choy, Westminster, CO (US); Phil Nikkel, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 355 days.

(21) Appl. No.: 13/654,718

(22) Filed: Oct. 18, 2012

(65) Prior Publication Data

US 2013/0038408 A1 Feb. 14, 2013

Related U.S. Application Data

(63) Continuation-in-part of application No. 13/151,631, filed on Jun. 2, 2011, which is a continuation-in-part of application No. 13/074,262, filed on Mar. 29, 2011, which is a continuation-in-part of application No. 13/036,489, filed on Feb. 28, 2011.

(51) Int. Cl.
*H03H 9/15* (2006.01)
*H03H 9/54* (2006.01)
*H03H 9/13* (2006.01)
*H03H 9/02* (2006.01)
(Continued)

(52) U.S. Cl.
CPC ............ *H03H 9/132* (2013.01); *H03H 9/0211* (2013.01); *H03H 9/02118* (2013.01); *H03H 9/175* (2013.01); *H03H 9/589* (2013.01)

(58) Field of Classification Search
CPC ............ H03H 9/02086; H03H 9/0211; H03H 9/02118; H03H 9/172; H03H 9/175; H03H 9/586; H03H 9/589
USPC .................... 333/187–189, 133; 310/334, 335
See application file for complete search history.

(56) References Cited

U.S. PATENT DOCUMENTS

| | | | |
|---|---|---|---|
| 4,975,892 A | 12/1990 | Defranould et al. | |
| 5,587,620 A | 12/1996 | Ruby et al. | |
| 5,873,153 A | 2/1999 | Ruby et al. | |

(Continued)

FOREIGN PATENT DOCUMENTS

| | | |
|---|---|---|
| CN | 101170303 | 4/2008 |
| DE | 102007012384 A1 | 9/2008 |

(Continued)

OTHER PUBLICATIONS

English language machine translation of JP 2007-208845, published Aug. 16, 2007, 9 pages.*

(Continued)

*Primary Examiner* — Barbara Summons

(57) ABSTRACT

A bulk acoustic wave (BAW) resonator device includes an acoustic reflector formed over a substrate and a resonator stack formed over the acoustic reflector. The acoustic reflector includes multiple acoustic impedance layers. The resonator stack includes a first electrode formed over the acoustic reflector, a piezoelectric layer formed over the first electrode, and a second electrode formed over the piezoelectric layer. A bridge is formed within one of the acoustic reflector and the resonator stack.

20 Claims, 9 Drawing Sheets

(51) Int. Cl.
*H03H 9/17* (2006.01)
*H03H 9/58* (2006.01)

(56) References Cited

U.S. PATENT DOCUMENTS

| | | | |
|---|---|---|---|
| 5,910,756 A | 6/1999 | Ella | |
| 6,107,721 A | 8/2000 | Lakin | |
| 6,215,375 B1 | 4/2001 | Larson, III et al. | |
| 6,262,637 B1 | 7/2001 | Bradley et al. | |
| 6,384,679 B1 | 5/2002 | Lorenz | |
| 6,384,697 B1 | 5/2002 | Ruby | |
| 6,396,200 B2 | 5/2002 | Misu et al. | |
| 6,507,983 B1 | 1/2003 | Ruby et al. | |
| 6,542,054 B2 | 4/2003 | Aigner et al. | |
| 6,617,751 B2 | 9/2003 | Sunwoo et al. | |
| 6,650,205 B2 | 11/2003 | Goetz et al. | |
| 6,709,776 B2 | 3/2004 | Noguchi et al. | |
| 6,787,897 B2 | 9/2004 | Geefay et al. | |
| 6,828,713 B2 | 12/2004 | Bradley et al. | |
| 6,849,475 B2 | 2/2005 | Kim | |
| 6,894,588 B2 | 5/2005 | Detlefsen | |
| 6,919,222 B2 | 7/2005 | Geefay | |
| 6,933,809 B2 | 8/2005 | Kyoung et al. | |
| 6,979,597 B2 | 12/2005 | Geefay et al. | |
| 7,109,826 B2 | 9/2006 | Ginsburg et al. | |
| 7,129,806 B2 | 10/2006 | Sato | |
| 7,161,283 B1 | 1/2007 | Geefay | |
| 7,179,392 B2 | 2/2007 | Robert et al. | |
| 7,230,509 B2 | 6/2007 | Stoemmer | |
| 7,233,218 B2 | 6/2007 | Park et al. | |
| 7,235,462 B2 | 6/2007 | Letertre et al. | |
| 7,268,647 B2 | 9/2007 | Sano et al. | |
| 7,275,292 B2 | 10/2007 | Ruby et al. | |
| 7,280,007 B2 | 10/2007 | Feng et al. | |
| 7,358,831 B2 | 4/2008 | Larson, III et al. | |
| 7,369,013 B2 * | 5/2008 | Fazzio et al. | 333/187 |
| 7,388,454 B2 | 6/2008 | Ruby et al. | |
| 7,468,608 B2 | 12/2008 | Feucht et al. | |
| 7,482,737 B2 | 1/2009 | Yamada et al. | |
| 7,563,475 B2 | 7/2009 | Ruby et al. | |
| 7,567,023 B2 | 7/2009 | Iwaki et al. | |
| 7,575,292 B2 | 8/2009 | Furukawa | |
| 7,602,101 B2 | 10/2009 | Hara et al. | |
| 7,602,102 B1 | 10/2009 | Barber et al. | |
| 7,629,865 B2 | 12/2009 | Ruby | |
| 7,655,963 B2 | 2/2010 | Sadaka et al. | |
| 7,714,684 B2 | 5/2010 | Ruby et al. | |
| 7,737,807 B2 | 6/2010 | Larson et al. | |
| 7,791,434 B2 * | 9/2010 | Fazzio et al. | 333/187 |
| 7,869,187 B2 | 1/2011 | McKinzie, III | |
| 7,966,722 B2 | 6/2011 | Hart et al. | |
| 7,978,025 B2 | 7/2011 | Yokoyama et al. | |
| 8,008,993 B2 | 8/2011 | Milsom et al. | |
| 8,084,919 B2 | 12/2011 | Nishihara et al. | |
| 8,248,185 B2 * | 8/2012 | Choy et al. | 333/187 |
| 8,384,497 B2 | 2/2013 | Zhang | |
| 8,692,631 B2 | 4/2014 | Zhang | |
| 8,902,023 B2 * | 12/2014 | Choy et al. | 333/187 |
| 2001/0045793 A1 | 11/2001 | Misu et al. | |
| 2002/0158716 A1 | 10/2002 | Pensala | |
| 2003/0213964 A1 | 11/2003 | Flynn et al. | |
| 2003/0227357 A1 | 12/2003 | Metzger et al. | |
| 2004/0027216 A1 | 2/2004 | Ma et al. | |
| 2004/0188241 A1 | 9/2004 | Rich et al. | |
| 2005/0248232 A1 | 11/2005 | Itaya et al. | |
| 2005/0269904 A1 | 12/2005 | Oka | |
| 2006/0017352 A1 | 1/2006 | Tanielian | |
| 2006/0038636 A1 | 2/2006 | Tsurumi et al. | |
| 2006/0114541 A1 | 6/2006 | Van Beek | |
| 2006/0132262 A1 | 6/2006 | Fazzio et al. | |
| 2006/0170519 A1 * | 8/2006 | Thalhammer et al. | 333/187 |
| 2006/0176126 A1 | 8/2006 | Wang et al. | |
| 2006/0226932 A1 | 10/2006 | Fazzio et al. | |
| 2006/0284706 A1 | 12/2006 | Ginsburg et al. | |
| 2007/0037311 A1 | 2/2007 | Izumi et al. | |
| 2007/0040473 A1 | 2/2007 | Ballandras et al. | |
| 2007/0069225 A1 | 3/2007 | Krames et al. | |
| 2007/0085632 A1 | 4/2007 | Larson, III et al. | |
| 2007/0205850 A1 | 9/2007 | Jamneala et al. | |
| 2007/0266548 A1 | 11/2007 | Fattinger | |
| 2007/0279153 A1 | 12/2007 | Ruby | |
| 2008/0129414 A1 | 6/2008 | Lobl et al. | |
| 2008/0129417 A1 | 6/2008 | Taniguchi | |
| 2008/0143215 A1 | 6/2008 | Hara et al. | |
| 2008/0258842 A1 | 10/2008 | Ruby et al. | |
| 2009/0064498 A1 | 3/2009 | Mok et al. | |
| 2009/0079302 A1 | 3/2009 | Wall et al. | |
| 2009/0127978 A1 | 5/2009 | Asai et al. | |
| 2009/0267453 A1 | 10/2009 | Barber et al. | |
| 2009/0267457 A1 | 10/2009 | Barber et al. | |
| 2010/0005654 A1 * | 1/2010 | Hart et al. | 29/847 |
| 2010/0033063 A1 * | 2/2010 | Nishihara et al. | 310/365 |
| 2010/0052176 A1 | 3/2010 | Kamada et al. | |
| 2010/0102358 A1 | 4/2010 | Lanzieri et al. | |
| 2010/0107389 A1 | 5/2010 | Nessler et al. | |
| 2010/0111808 A1 | 5/2010 | Pimputkar et al. | |
| 2010/0148637 A1 | 6/2010 | Satou | |
| 2010/0187948 A1 | 7/2010 | Sinha et al. | |
| 2010/0327697 A1 | 12/2010 | Choy et al. | |
| 2010/0327994 A1 | 12/2010 | Choy et al. | |
| 2011/0084779 A1 * | 4/2011 | Zhang | 333/187 |
| 2011/0121916 A1 | 5/2011 | Barber et al. | |
| 2011/0148547 A1 | 6/2011 | Zhang | |
| 2011/0180391 A1 | 7/2011 | Larson et al. | |
| 2012/0154074 A1 | 6/2012 | Ruby et al. | |
| 2012/0161902 A1 | 6/2012 | Feng et al. | |
| 2012/0194297 A1 | 8/2012 | Choy et al. | |
| 2012/0218055 A1 | 8/2012 | Burak et al. | |
| 2012/0218056 A1 | 8/2012 | Burak | |
| 2012/0218057 A1 | 8/2012 | Burak et al. | |
| 2012/0218058 A1 | 8/2012 | Burak et al. | |
| 2012/0218059 A1 | 8/2012 | Burak et al. | |
| 2012/0218060 A1 | 8/2012 | Burak et al. | |
| 2012/0248941 A1 | 10/2012 | Shirakawa et al. | |
| 2012/0280767 A1 | 11/2012 | Burak et al. | |
| 2013/0038408 A1 | 2/2013 | Burak et al. | |
| 2013/0127300 A1 | 5/2013 | Umeda et al. | |

FOREIGN PATENT DOCUMENTS

| | | |
|---|---|---|
| EP | 2299592 A1 | 3/2011 |
| FR | 2951027 A1 | 4/2011 |
| JP | 01157108 A | 6/1989 |
| JP | 6165507 A | 6/1994 |
| JP | 2003/017964 | 1/2003 |
| JP | 2006-186412 A | 7/2006 |
| JP | 2007-208845 * | 8/2007 |
| JP | 2007-295025 A | 11/2007 |
| JP | 2007295306 A | 11/2007 |
| JP | 2008/066792 | 3/2008 |
| JP | 2008066792 A | 3/2008 |
| JP | 2008-131194 | 6/2008 |
| JP | 2008-131194 A | 6/2008 |

OTHER PUBLICATIONS

R. Strijbos, "Design and Characterisation of High-Q Solidly-Mounted Bulk Acoustic Wave Filters", ECTC '07. Proceedings. 57th Electronic Components and Technology Conference, Publication Year: 2007, pp. 169-174.

Mohamed Abd Allaha, "Solidly mounted BAW resonators with layer-transferred AlN using sacrificial Si surfaces", Solid-State Electronics, ESSDERC 2009 Conference, vol. 54, Issue 9, Sep. 2010, 5 pages including only the abstract and drawing figures.

M.-A. Dubois, "Solidly mounted resonator based on aluminum nitride thin film", 1998 IEEE Ultrasonics Symposium, vol. 1, Publication Year: 1998 , pp. 909-912.

Office Action dated Oct. 6, 2014 from U.S. Appl. No. 13/443,113.

Office Action dated Oct. 23, 2014 from U.S. Appl. No. 13/445,268.

Co-pending U.S. Appl. No. 12/891,039 dated Sep. 27, 2010.

Co-pending U.S. Appl. No. 13/162,883 dated Jun. 17, 2011.

Ambacher, "Growth and Applications of Group III-Nitrides", J. Phys. D. Appl. Phys. 31, 1998, pp. 2653-2710.

(56) References Cited

OTHER PUBLICATIONS

Dalmau, R. et al., "AlN Bulk Crystals Grown on CIC seeds", Journal of Crystal Growth 281, 2005, pp. 68-74, published online Apr. 12, 2005.

Murphy, M.J. et al."Normal and Interverted Algan/GAN BAses Piezoelectric Field Effect Transistors Grown by Plasma Induced Molecular Beam Epitaxy", MRS Internet J. Nitride Semicond. Res. 4S1, G8.4 1999, pp. 1-6.

Paranjpe, et al., "Atomic Layer Deposition of AlOx for Thin Film Head Gap Applications", Journal of the Electrochemical Society 148, 2001, pp. G465-G471.

Puurenen et al., "Preparation by Atomic Layer Deposition and Characterisation of Catalyst Supports Surfaced with Aluminum Nitride", Dissertation for the Degree of Doctor of Science in Technology, Helsinki University of Technology, Espoo, Finland, Oct. 25, 2002, pp. 1-80.

Stutzman, M. et. al., "Playing with Polarity", Phys. Stat. Sol. (b) 225, No. 2, 2001, pp. 505-512.

Al-Ahmad, M. et al., "Piezoelectric-Based Tunable Microstrip Shunt Resonator", Proceedings of Asia-Pacific Microwave Conference 2006, pp. 1-4.

C-S Lee, et al., "Cooper-Airbridged Low-Noise GaAs PHEMT With Ti/WNx/Ti Diffusion Barrier for High-Frequency", IEEE Transactions on Electron Devices, vol. 53, Issue: 8, Aug. 2006, pp. 1753-1758.

\* cited by examiner

BULK ACOUSTIC WAVE RESONATOR DEVICE COMPRISING A BRIDGE IN AN ACOUSTIC REFLECTOR

CROSS-REFERENCE TO RELATED APPLICATIONS

This application is a continuation-in-part application of commonly owned patent application Ser. No. 13/151,631 to Burak et al., entitled "Film Bulk Acoustic Resonator Comprising a Bridge," filed on Jun. 2, 2011(published on Aug. 30, 2012 as U.S. patent application Publication No. 2012/0218057), which is a continuation-in-part of commonly owned U.S. patent application Ser. No. 13/074,262 to Burak et al., entitled "Stacked Acoustic Resonator Comprising a Bridge," filed on Mar. 29, 2011 (published on Aug. 30, 2012, as U.S. Patent Application Pub. No. 2012/0218055), which is a continuation-in-part of commonly owned U.S. patent application Ser. No. 13/036,489 to Burak et al., entitled "Coupled Resonator Filter Comprising Bridge" filed on Feb. 28, 2011 (published on Aug. 30, 2012, as U.S. Patent Application Pub. No. 2012/0218056). The present application claims priority under 35 U.S.C. §120 to U.S. patent application Ser. Nos. 13/151,631, 13/074,262 and 13/036,489, which are hereby incorporated by reference in their entireties.

BACKGROUND

Transducers generally convert electrical signals to mechanical signals or vibrations, and/or mechanical signals or vibrations to electrical signals. Acoustic transducers, in particular, convert electrical signals to acoustic waves and acoustic waves to electrical signal using inverse and direct piezo-electric effects. Acoustic transducers generally include acoustic resonators, such as surface acoustic wave (SAW) resonators or bulk acoustic wave (BAW) resonators, and may be used in a wide variety of electronic applications, such as cellular telephones, personal digital assistants (PDAs), electronic gaming devices, laptop computers and other portable communications devices. Generally, BAW resonators in which a resonator stack is formed over a cavity are referred to thin film bulk acoustic resonators (FBARs), and BAW resonators in which the resonator stack is formed of over an acoustic reflector are referred to as solidly mounted resonators (SMRs). For example, FBARs and SMRs may be used for electrical filters and voltage transformers. Generally, an acoustic resonator has a layer of piezoelectric material between two conductive plates (electrodes), which may be formed on a thin membrane. BAW resonator devices, in particular, generate acoustic waves that can propagate in all possible lateral directions when stimulated by an applied time-varying electric field of finite lateral extension, as well as higher order harmonic mixing products. The laterally propagating modes and the higher order harmonic mixing products may have a deleterious impact on functionality.

In BAW resonators, mitigation of acoustic losses at the boundaries and the resultant mode suppression and confinement in the active region of the BAW resonators (the region of overlap of the top electrode, the piezoelectric layer, and the bottom electrode) has been effected through various methods. For example, frames are provided along one or more sides of the BAW resonators. The frames suppress the amplitude of electrically excited piston mode and simultaneously create an acoustic impedance mismatch that suppresses upon reflection propagating modes in the frame region, thus improving the confinement of the piston mode within the active region of the BAW resonator. However, better acoustic energy confinement, as well as further improvements in quality factor Q due to the better acoustic energy confinement, is needed for increased efficiency of BAW resonators, particularly with respect to SMRs.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1A:
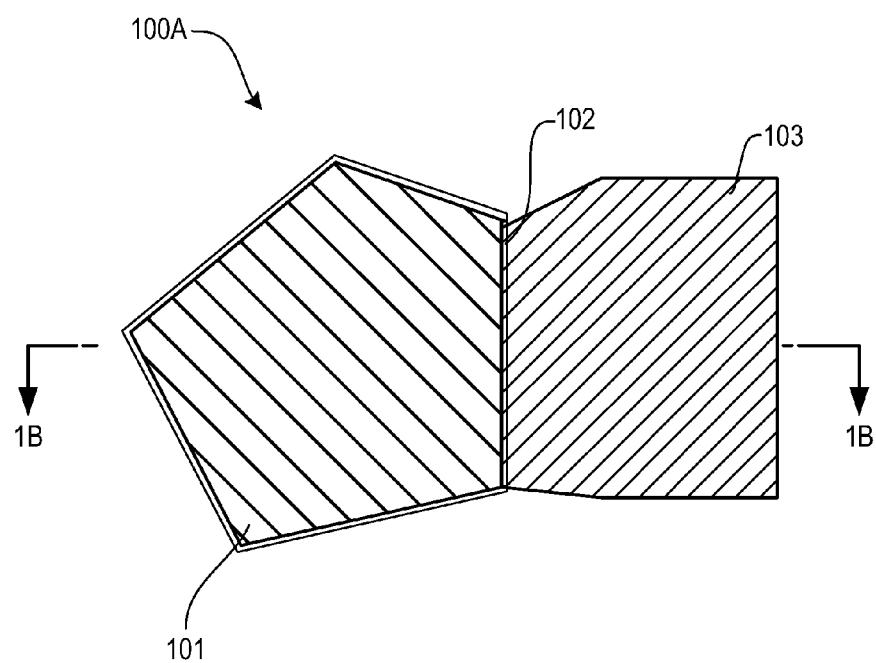
FIG. 1A shows a top-view of a BAW resonator device having an acoustic reflector in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonator devices that may provide various filters (e.g., ladder filters). Certain details BAW resonators, including FBARs, and resonator filters, materials thereof and their methods of fabrication may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; and U.S. Patent App. Pub. No. 2010/0327994 to Choy et al. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

FIG. 1A shows a top view of bulk acoustic wave (BAW) resonator device 100A in accordance with a representative embodiment. The BAW resonator device 100A includes a top electrode 101 having five (5) sides, with a connection side 102 configured to provide an electrical connection to interconnect 103. The interconnect 103 provides electrical signals to the top electrode 101 to excite desired acoustic waves in a piezoelectric layer (not shown in FIG. 1A) of the BAW resonator device 100A.

Figure 1B:
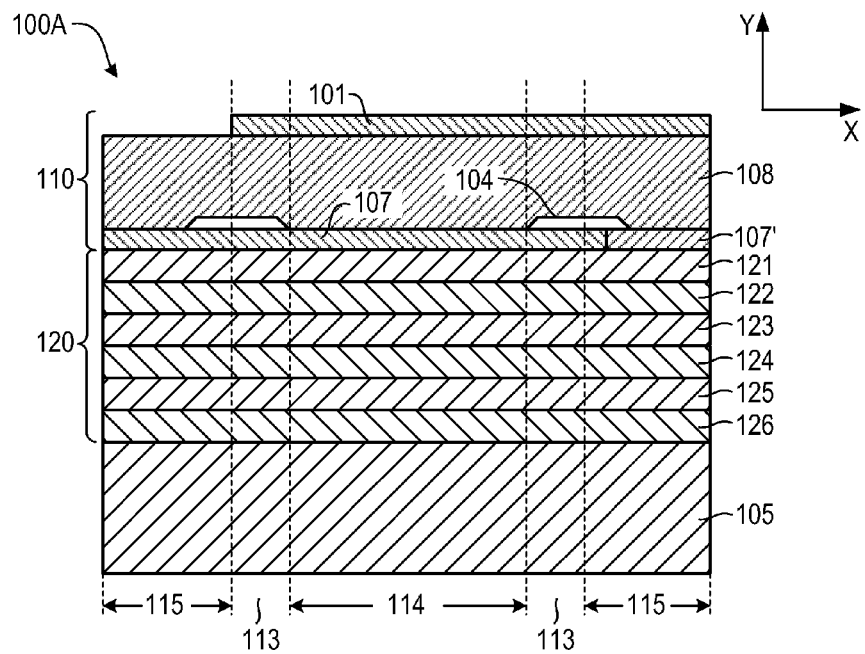
FIGS. 1B-1C are cross-sectional views of the BAW resonator devices taken along line 1B-1B of FIG. 1A, having acoustic reflectors and bridges between layers in accordance with representative embodiments.

FIG. 1B shows a cross-sectional view of the BAW resonator device 100A taken along line 1B-1B in accordance with a representative embodiment. The BAW resonator device 100A includes resonator stack 110, acoustic reflector 120 and substrate 105. The resonator stack 110 includes piezoelectric layer 108 sandwiched between first or bottom electrode 107 and second or top electrode 101, discussed below. The acoustic reflector 120 may be a distributed Bragg reflector (DBR) or other acoustic mirror, for example, formed of multiple acoustic impedance layers, indicated by representative first through sixth acoustic impedance layers 121 to 126.

More particularly, the acoustic reflector 120 is grown on the top of the substrate 105 and provides acoustic isolation between the substrate 105 and the acoustic stack 110. The acoustic impedance layers 121 to 126 of the acoustic reflector 120 are formed of materials having different acoustic impedances. For example, the acoustic impedance layers 121 to 126 may have alternating low and high acoustic impedances, such that acoustic impedance layer 121 has relatively low acoustic impedance, acoustic impedance layer 122 has relatively high acoustic impedance, acoustic impedance layer 123 has relatively low acoustic impedance, acoustic impedance layer 124 has relatively high acoustic impedance, acoustic impedance layer 125 has relatively low acoustic impedance, and acoustic impedance layer 126 has relatively high acoustic impedance. These differing acoustic impedances can be obtained, for instance, by forming the odd numbered acoustic impedance layers 121, 123 and 125 of a relatively soft material, and forming the even numbered acoustic impedance layers 122, 124 and 126 of a relatively hard material. Notably, the number of acoustic impedance layers may differ from six, without departing from the scope of the present teachings. Generally, the number of acoustic impedance layers may be determined by a tradeoff between desired mirror performance (e.g., the more layers the better) and cost and processing issues (e.g., the fewer layers the cheaper and more straightforward mirror growth and post-processing).

Notably, FIG. 1B depicts a single BAW resonator device 100A. If the BAW resonator device 100A were to be included in a device with additional BAW resonator devices, for example, in a filter including 5-10 resonators, the acoustic impedance layers 121 to 126 of the acoustic reflector 120 would need to be electrically isolated from DBRs of the other BAW resonator devices, as would be apparent to one of ordinary skill in the art. For example, a trench or other isolating means may be etched off around the acoustic reflector 120 down to the substrate 105.

The amount of acoustic isolation provided by acoustic reflector 120 generally depends on the contrast between the acoustic impedances of adjacent acoustic impedance layers 121 to 126, with a greater amount of contrast creating better acoustic isolation. In some embodiments, the acoustic reflector 120 is formed in pairs of dielectric materials having contrasting acoustic impedances. For example, the odd acoustic reflector layers 121, 123 and 125 may be formed of a material having low acoustic impedance, such as silicon oxide ($SiO_x$), where x is an integer, while the even acoustic reflector layers 122, 124 and 126, paired with corresponding odd acoustic reflector layers 121, 123 and 125, may be formed of a material having high acoustic impedance, such as tungsten (W) or molybdenum (Mo). In another example, the odd acoustic reflector layers 121, 123 and 125 may be formed of carbon-doped silicon oxide (CDO), while the even acoustic reflector layers 122, 124 and 126, paired with corresponding odd acoustic reflector layers 121, 123 and 125, may be formed of silicon nitride ($SiN_x$), where x is an integer. A benefit of this pair is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. This process may be less expensive (e.g., by about 10%) than producing an etched air cavity, for example, thus providing a cost effective substitute for an air cavity. The acoustic reflector 120 may be fabricated using various alternative techniques, an example of which is described in U.S. Pat. No. 7,358,831 to Larson, III et al., which is hereby incorporated by reference in its entirety. Of course, the low and high acoustic impedance materials forming the stacked layers of the acoustic reflector 120 may vary without departing from the scope of the present teachings.

In addition to potentially lowering the cost of fabricating the BAW resonator device 100A, the acoustic reflector 120 may also improve thermal conductivity and step power handling. However, one practical shortcoming of acoustic reflector 120 is that it is an imperfect acoustic mirror, which causes energy to be lost both vertically into the substrate 105 and laterally along the various acoustic impedance layers 121 to 126. This loss of energy and extension of mechanical motion from an active region 114 of the resonator stack 110 to the surroundings tends to diminish signal power and reduce bandwidth. For example, in one embodiment, acoustic reflector 120 may reduce the bandwidth of an input signal from 100 MHz to 80 MHz. However, inclusion of a bridge at a perimeter of the active area 114, such as bridge 104, discussed below, reduces this loss of energy.

Referring again to FIG. 1B, the bottom electrode 107 of the resonator stack 110 is disposed over the top layer (acoustic reflector layer 121) of the acoustic reflector 120. In other words, the first acoustic impedance layer 121 may be adjacent bottom electrode 107 of the acoustic stack 110, and the second acoustic impedance layer 122 may be formed adjacent the first acoustic impedance layer 121, and so on. In the depicted representative embodiment, a planarization layer 107' is also provided on the acoustic reflector 120, as shown. The planarization layer 107' may include non-etchable borosilicate glass (NEBSG), for example. In general, planarization layer 107' does not need to be present in the structure (as it increases overall processing cost), but when present, it may improve quality of growth of subsequent layers and simplify processing. A piezoelectric layer 108 is disposed over the bottom electrode 107, and the top electrode 101 (also shown in FIG. 1A) is disposed over the piezoelectric layer 108. As should be appreciated by one of ordinary skill in the art, the structure of the resonator stack 110, provided by the bottom electrode 107, the piezoelectric layer 108 and the top electrode 101, forms a BAW resonator. When the BAW resonator is disposed over an acoustic reflector, such as the acoustic reflector 120, it is a so-called solidly mounted resonator (SMR). The present teachings contemplate the use of SMRs in a variety of applications, including filters (e.g., ladder filters comprising a plurality of BAW resonators).

In the depicted embodiment, bridge 104 is buried between the bottom electrode 107 and the piezoelectric layer 108. The bridge 104 may be disposed along all sides of the BAW resonator device 100A (e.g., along a perimeter of the BAW resonator device 100A). Also, for example, the bridge 104 (and other bridges described in connection with representative embodiments below) may have a trapezoidal cross-sectional shape. It is emphasized that the trapezoidal cross-sectional shape of the bridge 104 of the representative embodiments is merely illustrative and the bridges are not limited to a trapezoidal cross-sectional shape. For example, the cross-sectional shape of the bridges of the representative embodiments could be square or rectangular, or of an irregular shape. The "slanting" walls of bridge 104 are beneficial to the quality of layers (e.g., the quality of the crystalline piezoelectric layer(s)) grown over the bridge 104. Illustrative dimensions of the bridge 104 are approximately 2.0 μm to approximately 10.0 μm in width (x-dimension in the coordinate system shown in FIG. 1B) and approximately 300 Å to approximately 1500 Å in height (y-dimension in the coordinate system shown in FIG. 1B).

The bridge 104 (and other bridges described in connection with representative embodiments below) forms a decoupling region 113 between an inside edge of the bridge 104 and the terminating edge of the top electrode 101 (shown at top left side of FIG. 1B, for example). The inner boundaries of the decoupling region 113 define the active region 114 of the acoustic resonator 110 and the acoustic reflector 120, and the outer boundaries of the decoupling region 113 define a field region 115. Generally, optimum width of the bridge 104 depends on the suppression of the parasitic eigen-modes excited mechanically (due to the presence of acoustic impedance mismatch in lateral direction) and electrically (due to termination of electric field acting on the piezoelectric layer 108) at the boundary of the active region 114.

The bridge 104 needs to be wide enough to ensure suitable decay of complex evanescent waves excited at the boundary of the active region 114 and the decoupling region 113. Wide bridges minimize tunneling of energy into the field region 115 where propagating modes exist at the frequency of operation. On the other hand, when the bridge 104 is too wide, reliability issues can arise and can also limit placement of similar BAW resonator devices (not shown) from being placed in proximity, thus unnecessarily increasing the total area of a chip. In practical situations, the propagating component of the complex evanescent wave may be used to find the optimum width of the bridge 104. For example, when the width of bridge 104 is equal to an integer multiple of the quarter-wavelength of the complex evanescent wave, the suppression of the eigen-modes may be further increased which may be manifested by parallel resistance Rp and quality factor Q attaining maximum values. Typically, depending on the details of the excitation mechanism, other propagating modes of the decoupling region 113, such as shear modes and flexural modes, may also impact parallel resistance Rp and quality factor Q. The width of the bridge 104 may be modified in view of these other propagating modes. Such optimum width of the bridge 104 may be determined experimentally.

Improvement in the quality factor Q must be weighed against a decrease in the electromechanical effective coupling coefficient $kt^2$, which decreases with increasing width of the decoupling region 113. The decrease of electromechanical effective coupling coefficient $kt^2$ is caused by decreased overlap between a piston mode excited in the active region 114 and the electric field extending over the active region 114 and the decoupling region 113. Degradation of the coupling coefficient $kt^2$ results in degradation of insertion loss ($S_{21}$) of a filter comprising BAW resonators. As such, the size and placement the bridge 104 may be optimized experimentally, as mentioned above.

The bridge 104 (and other bridges described in connection with representative embodiments below) has a height (y-dimension in the coordinate system of FIG. 1B) of approximately 300 Å to approximately 1500 Å, as mentioned above. Notably, the lower limit of the height is determined by the limits of the process of releasing sacrificial material in forming the bridge 104, and the upper limit of the height is determined by the quality of layers grown over the bridge 104 and by the quality of subsequent processing of possibly non-planar structures.

Illustratively, each of the bottom electrode 107 and top electrode 101 may be formed of tungsten (W) having a thickness of approximately 1000 Å to approximately 10000 Å. Other materials may be used for the bottom electrode 107 and/or the top electrode 101, including but not limited to molybdenum (Mo) or a bi-metal material. Illustratively, the piezoelectric layer 108 is formed of aluminum nitride (AlN) having a thickness of approximately 5000 Å to approximately 25000 Å. Other materials may be used for the piezoelectric layer 108, including but not limited to zinc oxide (ZnO). The bridge 104 may be formed by patterning a sacrificial material over the bottom electrode 107, and forming the depicted layer thereover. After the remaining layers of the BAW resonator device 100A are formed as desired, the sacrificial material is released leaving the bridge 104 "unfilled" (i.e., containing or filled with air). The sacrificial material used to form the bridge 104 may be phosphosilicate glass (PSG), for example.

In a representative embodiment, the bridge 104 defines all or part of a perimeter along the active region 114 of the BAW resonator device 100A, as discussed above. As should be appreciated by one of ordinary skill in the art, the active region 114 of the BAW resonator device 100A is bordered around its perimeter by an acoustic impedance discontinuity created at least in part by the bridge 104, below by an acoustic impedance discontinuity due to the reflection by the acoustic reflector 120 and above by air. It is noted that the bridge 104 does not necessarily have to extend along all edges of the BAW resonator device 100A, and therefore not along the entire perimeter of the active region 114 and/or the BAW resonator device 100A. For example, the bridge 104 may be provided on four "sides" of the five-sided BAW resonator device 100A shown in FIG. 1A.

The acoustic impedance mismatch provided by the bridge 104 causes reflection and suppression of acoustic waves at the boundary that may otherwise propagate out of the active region 114 and be lost, resulting in energy loss. The bridge 104 serves to confine the modes of interest within the active region 114 of the BAW resonator device 100A and to reduce energy losses in the BAW resonator device 100A. Reducing such losses serves to increase the quality factor Q of the FBAR 100. In filter applications of the BAW resonator device 100A, as a result of the reduced energy loss, the insertion loss ($S_{21}$) is beneficially improved.

Figure 1C:
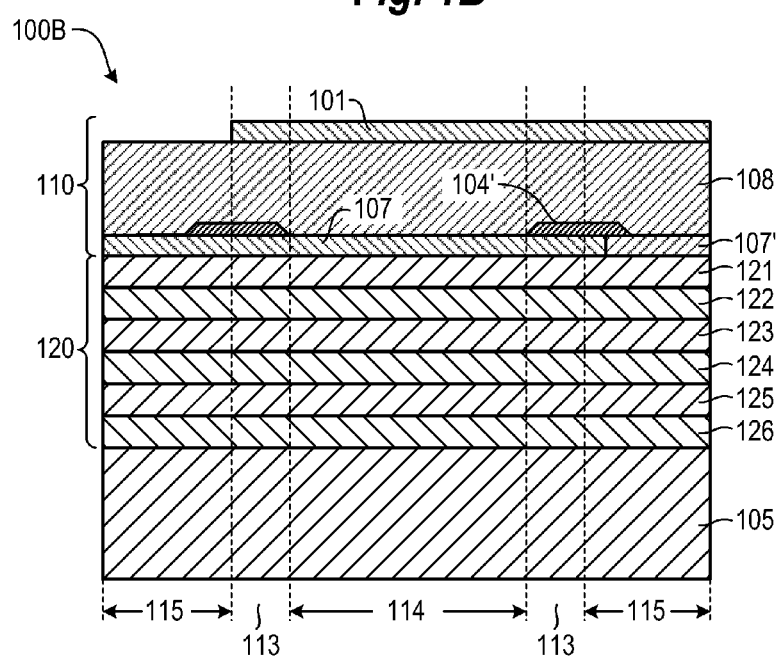

In the representative embodiment shown and described in connection with FIGS. 1A and 1B, the bridge 104 is unfilled (i.e., contains air as the acoustic medium), as mentioned above. In alternative embodiments, the bridge 104 is "filled" (i.e., contains a dielectric or metal material to provide the desired acoustic impedance discontinuity). For example, FIG. 1C shows a cross-sectional view of BAW resonator device 100B in which bridge 104' is "filled" with a material having acoustic impedance in order to provide significantly large lateral acoustic impedance discontinuity at the boundary between the active region 114 and the decoupling region 113. The mechanism of reducing losses in the filled bridge 104' relies on suppression and confinement of the propagating and evanescent eigen-modes, which are mechanically excited at an interface between the active region 114 and the decoupling region 113. Both ends of the filled bridge 104' provide mechanical discontinuities allowing control of the phase of the reflected mode and providing overall beneficial suppression of the propagating eigen-modes in the active region 114. In certain embodiments, bridge 104' is filled with NEBSG, carbon doped oxide (CDO), silicon carbide (SiC) or other suitable dielectric material. In other embodiments, bridge 104' may be filled with tungsten (W), molybdenum (Mo), copper (Cu) or iridium (Ir), for example. The bridge 104' is fabricated by forming a layer of NEBSG (or other fill material) over the bottom electrode 107 by a known method, patterning and etching the NEBSG layer by known methods to provide the bridge 104', and forming the piezoelectric layer 108 and the top electrode 101 of the resonator stack 110 thereover.

Figure 2A:
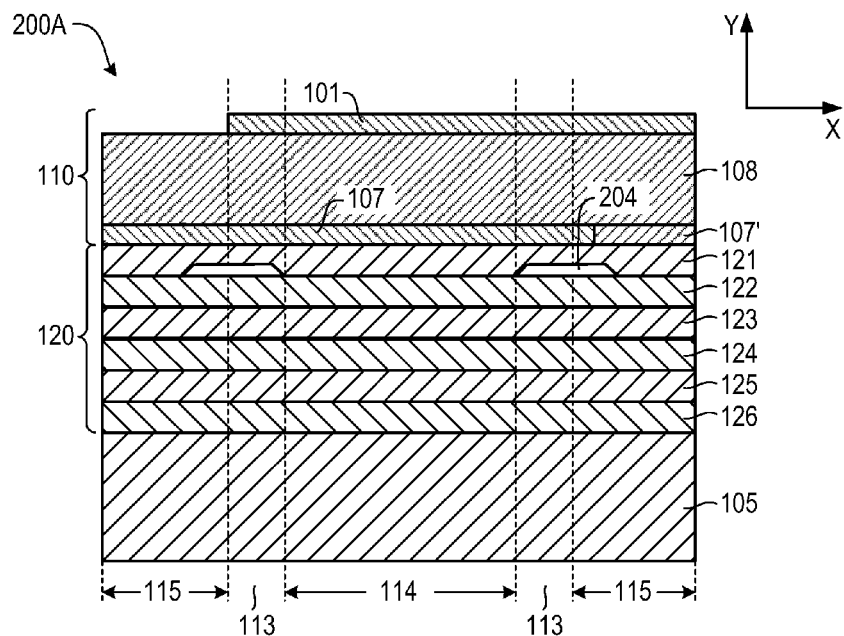
FIGS. 2A-2B are cross-sectional views of BAW resonator devices having acoustic reflectors and bridges between alternative layers in accordance with representative embodiments.
Figure 2B:
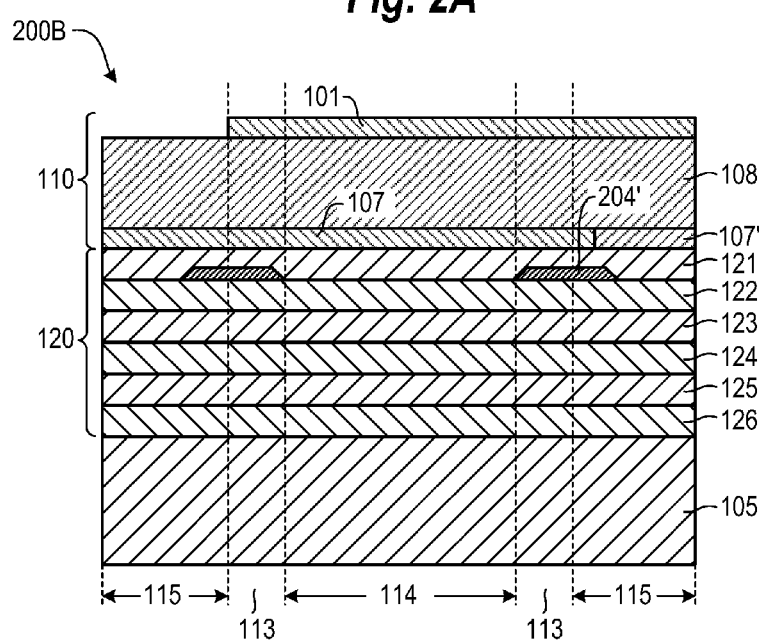

In alternative embodiments, the bridge (unfilled or filled) may be formed in a location other than between bottom electrode and the piezoelectric layer, as shown in FIGS. 1B and 1C. For example, FIGS. 2A-2B are cross-sectional views of BAW resonator devices having bridges disposed between layers of the acoustic reflector in accordance with representative embodiments. An advantage of forming bridges inside the acoustic reflector stack relies on the fact that there is a significant amount of acoustic energy (e.g., up to about 20 percent, depending on reflector design) confined in the acoustic reflector region. That energy can couple to interfacial/trapped modes supported by the acoustic reflector stack and leave the active region in the lateral direction. Placing one or more bridges along the perimeter of the active device in the acoustic reflector stack allows parasitic coupling, for example, to be minimized, and therefore increases the resonator's quality factor Q. However, placing bridges inside the acoustic reflector stack may increase processing cost and complexity. Thus, the advantages may be weighed against the cost/performance tradeoffs.

Referring to FIGS. 2A and 2B, the BAW resonator devices 200A, 200B include resonator stack 110, acoustic reflector 120 and substrate 105. The resonator stack 110 includes piezoelectric layer 108 sandwiched between first or bottom electrode 107 and second or top electrode 101, discussed below. The acoustic reflector 120 may be a DBR or other acoustic mirror, for example, formed of multiple acoustic impedance layers 121 to 126. The resonator stack 110 and the acoustic reflector 120 are substantially the same as described above with reference to FIGS. 1A through 1C (with the exception of bridge location), and therefore the corresponding descriptions will not necessarily be repeated. Further, the general purpose and functionality of the bridges described with reference to FIGS. 2A and 2B are substantially the same as described above with reference to FIGS. 1A through 1C, and therefore the corresponding descriptions are not necessarily repeated.

In the embodiment depicted in FIG. 2A, bridge 204 is buried between the first and second acoustic impedance layers 121 and 122. As discussed above, the bridge 204 is generally disposed along a perimeter of the BAW resonator device 200A, defining coupling region 113, active region 114 and field region 115. Also, the bridge 204 may have a trapezoidal cross-sectional shape, for example, where the "slanting" walls of bridge 204 are beneficial to the quality of layers (e.g., the quality of the acoustic impedance, bottom electrode and crystalline piezoelectric layer(s)) grown over the bridge 204. Illustrative dimensions of the bridge 104 are approximately 2.0 μm to approximately 10.0 μm in width (x-dimension in the coordinate system shown in FIG. 1B) and approximately 300 Å to approximately 1500 Å in height (y-dimension in the coordinate system shown in FIG. 2A).

The bridge 204 has a height (y-dimension in the coordinate system of FIG. 1B) of approximately 300 Å to approximately 1500 Å, as mentioned above. Notably, the lower limit of the height is determined by the limits of the process of releasing sacrificial material in forming the bridge 204, and the upper limit of the height is determined by the quality of layers grown over the bridge 204 and by the quality of subsequent processing of possibly non-planar structures. The bridge 204 may be formed by patterning a sacrificial material over the second acoustic impedance layer 122, and forming the depicted layer thereover. After the remaining layers of the BAW resonator device 200A are formed as desired, the sacrificial material is released leaving the bridge 204 "unfilled" (i.e., containing or filled with air). The sacrificial material used to form the bridge 204 may be PSG, for example.

In a representative embodiment, the bridge 204 defines all or part of a perimeter along the active region 114 of the BAW resonator device 200A, as discussed above with regard to bridge 104. As should be appreciated by one of ordinary skill in the art, the active region 114 of the BAW resonator device 200 is bordered around its perimeter by an acoustic impedance discontinuity created at least in part by the bridge 204, and above and below by an acoustic impedance discontinuity due to the reflection from air and by the acoustic reflector 120. It is noted that the bridge 204 does not necessarily have to extend along all edges of the BAW resonator device 200A, and therefore not along the entire perimeter of the active region 114 and/or the BAW resonator device 200A. Also as discussed above with regard to bridge 104, the acoustic impedance mismatch provided by the bridge 204 causes reflection and suppression of acoustic waves at the boundary that may otherwise propagate out of the active region 114 and be lost, resulting in energy loss. The bridge 204 serves to suppress and confine the modes of interest within the active region 114 of the BAW resonator device 200A and to reduce energy losses in the BAW resonator device 200A. Reducing such losses serves to increase the quality factor Q of the BAW resonator device 200A. In filter applications of the BAW resonator device 200A, as a result of the reduced energy loss, the insertion loss ($S_{21}$) is beneficially improved.

In alternative embodiments, the bridge 204 is "filled" (i.e., contains a dielectric or metal material to provide the desired acoustic impedance discontinuity). For example, FIG. 2B shows a cross-sectional view of BAW resonator device 200B in which bridge 204' is "filled" with a material having acoustic impedance in order to provide significantly large lateral acoustic impedance discontinuity at the boundary between the active region 114 and the decoupling region 113. The mechanism of reducing losses in the filled bridge 204' relies on suppression and confinement of the propagating and evanescent eigen-modes, which are mechanically excited at an interface between the active region 114 and the decoupling region 113, as described above. Both ends of the filled bridge 204' provide mechanical discontinuities allowing control of the phase of the reflected mode and providing overall beneficial suppression of the propagating eigen-modes in the active region 114. In certain embodiments, bridge 204' is filled with NEBSG, CDO, SiC, W, Mo, Cu, Ir, or other suitable material, for example. The bridge 204' is fabricated by forming a layer of NEBSG (or other fill material) over the second acoustic impedance layer 122 by a known method, patterning and etching the NEBSG layer by known methods to provide the bridge 204', and forming the first acoustic impedance layer 121, the bottom electrode 107, the piezoelectric layer 108 and the top electrode 101 thereover.

In alternative embodiments, unfilled or filled bridges may be formed between any two adjacent layers of a BAW resonator device, without departing from the scope of the present teachings. For example, an unfilled or filled bridge may be formed between the piezoelectric layer 108 and the top electrode 101 of the resonator stack 110. Likewise, an unfilled or filled bridge may be formed between the second and third acoustic impedance layers 122 and 123, between the third and fourth acoustic impedance layers 123 and 124, between the fourth and fifth acoustic impedance layers 124 and 125, or between the fifth and sixth acoustic impedance layers 125 and 126 of the acoustic reflector 120. Also, an unfilled or filled bridge may be formed between the sixth acoustic impedance layer 126 of the acoustic reflector 120 and the substrate 105. Further, in alternative embodiments, unfilled or filled bridges may be buried within a single layer of a BAW resonator device, without departing from the scope of the present teachings. For example, an unfilled or filled bridge may be formed buried within the piezoelectric layer 108, as described for example in commonly owned U.S. patent application Ser. No. 13/208,909 to Burak et al., filed on Aug. 12, 2011, which is hereby incorporated by reference in its entirety.

In alternative embodiments, unfilled or filled bridges may be formed between any two adjacent layers or within a single layer of various other types of resonator devices, without departing from the scope of the present teachings. For example, an unfilled or filled bridge may be formed between or within layers of a stacked bulk acoustic resonator (SBAR) device, a double bulk acoustic resonator (DBAR) device, or a coupled resonator filter (CRF) device, which include acoustic reflectors (e.g., in place of cavities). Examples of various alternative types of resonator devices, including unfilled or filled bridges, are provided in commonly owned U.S. Patent Application Pub. No. 2012/0218056 to Burak, published Aug. 30, 2012, and U.S. Patent Application Pub. No. 2012/0218055 to Burak et al., published Aug. 30, 2012, which are hereby incorporated by reference in their entireties.

In the embodiments described above with reference to FIGS. 1A-1C and FIGS. 2A-2B, the representative BAW resonator devices include a single bridge (e.g., bridge 104, 104', 204, 204'). However, in alternative embodiments, additional bridges may be included in a BAW resonator device. For example, FIGS. 3A-3D are cross-sectional views of BAW resonator devices, each of which has an acoustic reflector and multiple bridges, in accordance with representative embodiments.

More particularly, one bridge is provided in one layer of the BAW resonator device and a second bridge is provided in another layer. In the embodiments depicted by FIGS. 3A-3D, one of the bridges is located in the acoustic reflector (between the first and second acoustic impedance layers) and the other bridge is located in the resonator stack (between the bottom electrode and piezoelectric layer). The bridges may be generally concentric, although not necessarily circular in shape, and may be disposed about a perimeter that encloses the active region of the BAW resonator device.

By placing the bridges under different combinations of layers, the various embodiments can be studied to test the degree of coupling of modes in the active region (e.g., active region 114) and the modes in the field region (e.g., field region 115). Generally, the bridges decouple modes with a comparatively large propagation constant $k_r$ from the modes in the field region 115. As described below, the various embodiments comprise combinations of unfilled and filled bridges. Many details of the present embodiments are common to those described above in connection with the representative embodiments of FIGS. 1A-1C and FIGS. 2A-2B.

Figure 3A:
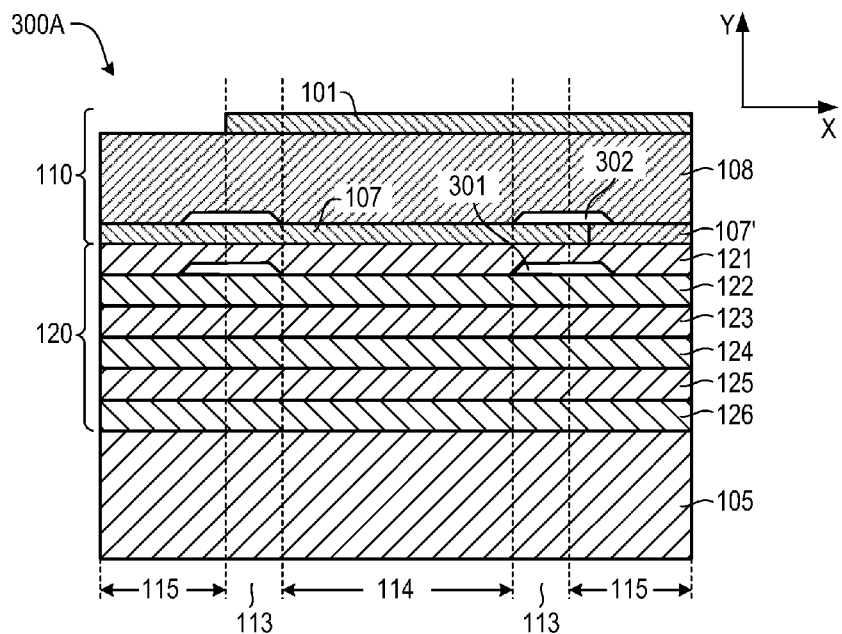
FIGS. 3A-3D are cross-sectional views of BAW resonator device having acoustic reflectors and multiple bridges in accordance with representative embodiments.

FIG. 3A shows a cross-sectional view of the BAW resonator device 300A. For purposes of illustration, it is assumed that the BAW resonator device 300A has substantially the same shape from the top view as the BAW resonator device 100, as shown in FIG. 1A, in which case the cross-sectional view of FIG. 3A would be taken along line 1B-1B. The BAW resonator device 300A includes resonator stack 110, acoustic reflector 120 and substrate 105. The resonator stack 110 includes piezoelectric layer 108 sandwiched between bottom electrode 107 and top electrode 101. A bottom-electrode planarization layer 107' is also (optionally) provided as shown, which may include NEBSG, for example. The acoustic reflector 120 may be a DBR or other acoustic mirror, for example, formed of multiple acoustic impedance layers 121 to 126 stacked over the substrate 105.

In the depicted embodiment, a first bridge 301 is provided between the first acoustic impedance layer 121 and the second acoustic impedance layer 122, and a second bridge 302 is provided between the bottom electrode 107 and the piezoelectric layer 108. Each of the first and second bridges 301, 302 is disposed along all sides of the BAW resonator device 300A (i.e., along a perimeter of the BAW resonator device 300A), as discusses above. In representative embodiments, the first and second bridges 301, 302 have a trapezoidal cross-sectional shape, for example. However, as discussed above, the trapezoidal cross-sectional shape of the first and second bridges 301, 302 of the representative embodiments is merely illustrative and the first and second bridges 301, 302 are not limited to a trapezoidal cross-sectional shape. Notably, the first bridge 301 and the second bridge 302 are not necessarily the same shape (e.g., one could have trapezoidal cross-sectional shape and one could have a rectangular cross-sectional in shape). Typical dimensions of the first and second bridges 301, 302 are approximately 2.0 μm to approximately 10.0 μm in width (x-dimension in the coordinate system shown in FIG. 3A) and approximately 300 Å to approximately 1500 Å in height (y-dimension in the coordinate system shown in FIG. 3A).

Generally, the first and second bridges 301, 302 need to be wide enough to ensure suitable decay of complex evanescent waves at the boundary of active region 114 and the decoupling region 113 in order to minimize tunneling of modes into field region 115 where propagating modes exist at the frequency of operation. Notably, when there are multiple bridges, such as first and second bridges 301 and 302, the inner boundary of the decoupling region 113 (and correspondingly the outer boundary of the active region 114) of the BAW resonator device is determined by the bridge extending furthest toward the center of the BAW resonator device. In the representative embodiment depicted in FIG. 3A, this is not a factor since the first and second bridges 301, 302 are substantially vertically aligned. Also, similarly as for bridge 104 in BAW resonator device 100A, the propagating component of the complex evanescent modes or other propagating modes (like shear and flexural modes) allowed in regions bounded vertically by first and second bridges 301, 302 can be used to increase suppression of the eigen-modes in the active region 114 by selecting the proper width of the bridges. On the other hand, if the first and second bridges 301, 302 are too wide, reliability issues can arise and can also limit similar BAW resonator devices (not shown) from being placed in proximity (thus unnecessarily increasing the total area of a chip). As such, the optimum widths of the first and second bridges 301, 302 may be determined experimentally. Further, neither the widths nor the locations of first and second bridges 301 and 302 need to be the same.

In addition, the width and position of the first and second bridges 301, 302 and the decoupling region 113 are selected to improve the quality factor Q, as discussed above. In general, the greater the decoupling region 113 corresponding to the first bridge 301 and/or the second bridge 302, the greater the improvement in the quality factor Q with the improvement realized being fairly small after an initial increase. The improvement in the quality factor Q is weighed against a decrease in the electromechanical effective coupling coefficient $kt^2$, which decreases with increasing decoupling region 113. Degradation of the coupling coefficient $kt^2$ results in a degradation of insertion loss ($S_{21}$) of a filter comprising BAW resonator devices. As such, the decoupling region 113 may be optimized experimentally.

The first and second bridges 301, 302 have a height (y-dimension in the coordinate system of FIG. 3A) of approximately 300 Å to approximately 1500 Å, for example. Notably, the lower limit of the height is determined by the limits of the process of releasing sacrificial material in the forming of the first and second bridges 301, 302, and the upper limit of the height is determined by the quality of layers grown over the first and second bridges 301, 302 and by the quality of subsequent processing of possibly non-planar structures. The first and second bridges 301, 302 may be formed by patterning a sacrificial material (e.g., PSG) over the bottom electrode 107 and the first acoustic impedance layer 121, respectively, and forming the depicted layers thereover. After the layers of the BAW resonator device 300A are formed as desired, the sacrificial material is released, leaving the first and second bridges 301, 302 unfilled (i.e., containing air).

In a representative embodiment, the first and second bridges 301, 302 define a perimeter along the active region 114 of the BAW resonator device 300A. As should be appreciated by one of ordinary skill in the art, the active region of the BAW resonator device 300A is bordered around its perimeter by an acoustic impedance discontinuity created at least in part by the first and second bridges 301, 302 by an acoustic impedance discontinuity due to the presence of air. In other embodiments described more fully below (e.g., with reference to FIGS. 3B-3D), the first bridge 301, the second bridge 302, or both, are filled with a material to provide the desired acoustic impedance discontinuity. In yet other embodiments, parts of the first bridge 301, the second bridge 302, or both, can be filled along some edges of the BAW resonator device 300A, and can be unfilled (i.e., contain air) along other edges of BAW resonator device 300A.

It is noted that one or both of the first and second bridges 301, 302, do not necessarily have to extend along all edges of the BAW resonator device 300A, and therefore may not necessarily extend along the entire perimeter of the BAW resonator device 300A. For example, when the BAW resonator device 300A has five sides (like the five-sided BAW resonator device 100 shown in FIG. 1A), one or both of the first and second bridges 301, 302 may be provided on just four of the five "sides." In certain embodiments, the first bridge 301 is disposed along the same sides of the BAW resonator device 300A as the second bridge 302. In other embodiments, the first and second bridge 301, 302 are disposed along different sides and/or a different number of sides from one another.

The acoustic impedance mismatch provided by the first and second bridges 301, 302 causes suppression of acoustic waves at the boundary that may otherwise propagate out of the active region 114 and be lost, resulting in energy loss. The first and second bridges 301, 302 serve to confine and suppress the modes of interest within the active region 114 of the BAW resonator device 300A and to reduce energy losses in the BAW resonator device 300A. Reducing such losses serves to increase the quality factor Q of the BAW resonator device 300A. In filter applications of the BAW resonator device 300A, as a result of the reduced energy loss, the insertion loss ($S_{21}$) is beneficially improved.

Figure 3B:
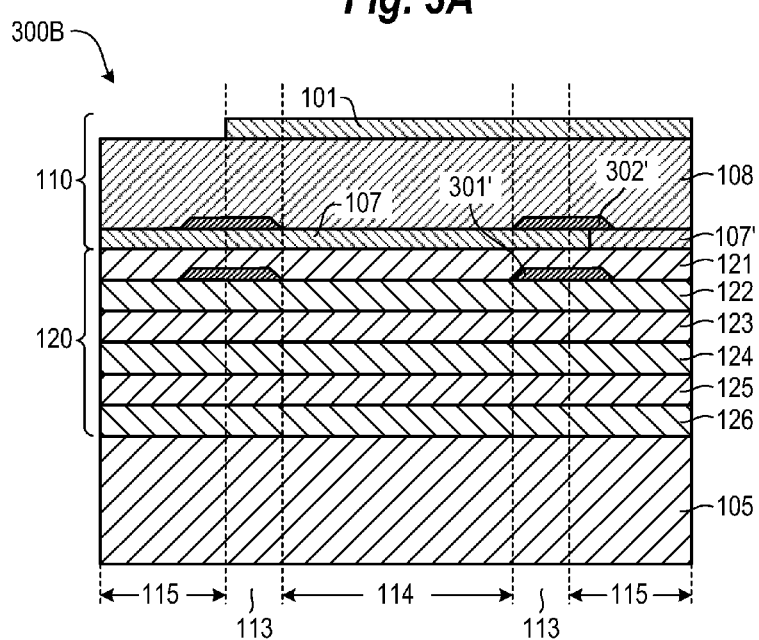

In the representative embodiment shown and described in connection with FIG. 3A, the first and second bridges 301, 302 are unfilled (i.e., contain air as the acoustic medium). In comparison, FIG. 3B shows a cross-sectional view of BAW resonator device 300B, which is substantially the same as BAW resonator device 300A, but with both first and second bridges 301' and 302' filled with a material to provide the acoustic impedance discontinuity to reduce losses. In certain embodiments, first bridge 301' and second bridge 302' are filled with NEBSG, CDO, SiC, or other suitable dielectric material. In other embodiments, first bridge 301' and second bridge 302' are filled with one of W, Mo, Al or Ir, or other suitable metal. The first and second bridges 301', 302' are fabricated by forming the NEBSG or other fill material over he first acoustic impedance layer 121 and the bottom electrode 107, respectively, by known methods, and forming respective layers of the BAW resonator device 300B thereover.

Figure 3C:
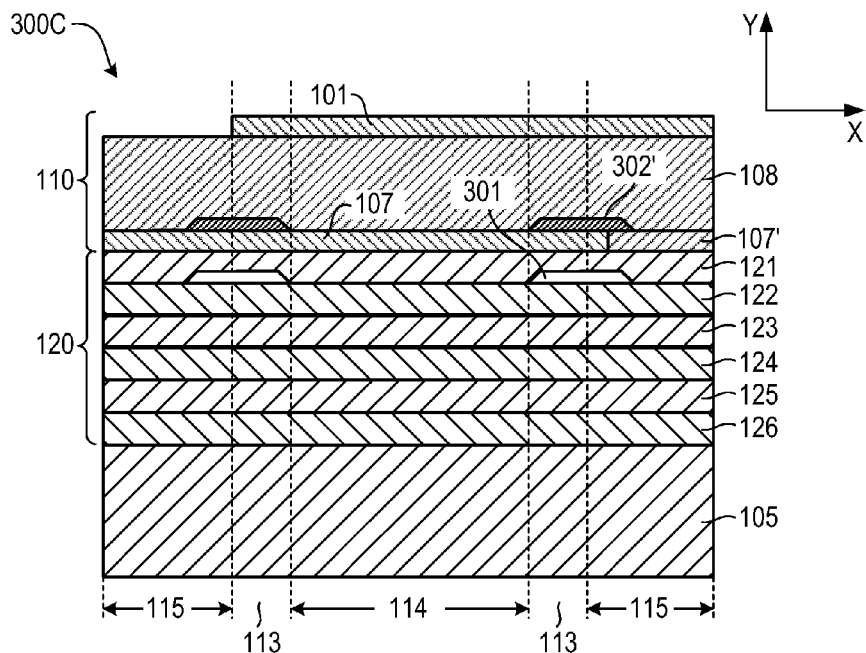

FIG. 3C shows a cross-sectional view of BAW resonator device 300C in which the second bridge 302' is filled with a material to provide the acoustic impedance discontinuity to reduce losses, and the first bridge 301 contains air (unfilled). The second bridge 302' of the BAW resonator device 300C is fabricated by patterning a material (e.g., NEBSG) over the bottom electrode 107 that will not release before forming the piezoelectric layer 108. The first bridge 301 is formed by patterning a sacrificial material (e.g., PSG) over the second acoustic impedance layer 122 before forming the first acoustic impedance layer 121, and subsequently releasing the sacrificial material as described above.

Figure 3D:
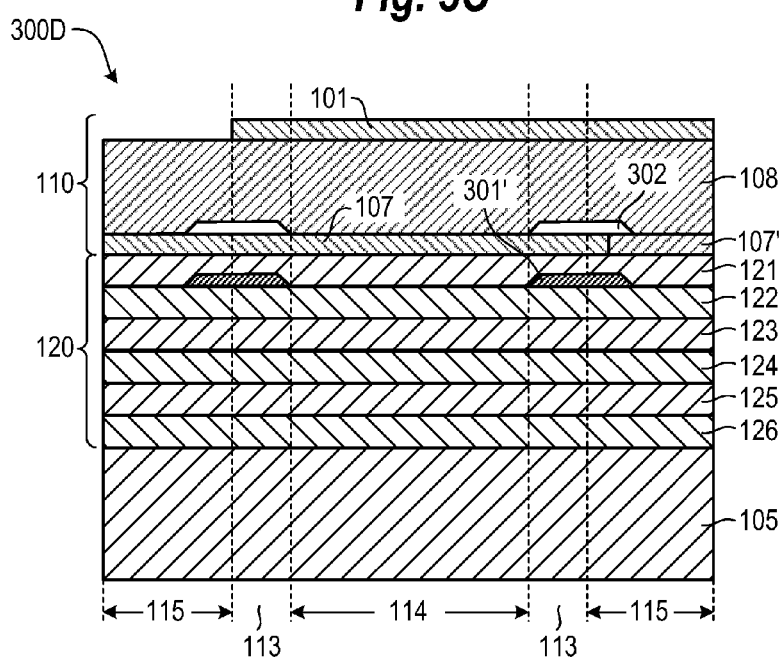

FIG. 3D shows a cross-sectional view of BAW resonator device 300D in which the second bridge 302 contains air, and the first bridge 301' is filled with a material to provide the acoustic impedance discontinuity to reduce losses. The second bridge 301' of the BAW resonator device 300D is fabricated by patterning a material (e.g., NEBSG) over the second acoustic impedance layer 122 that will not release before forming the first acoustic impedance layer 121. The second bridge 302 is formed by patterning a sacrificial material (e.g., PSG) over the bottom electrode 107 before forming the piezoelectric layer 108, and subsequently releasing the sacrificial material as described above.

In the embodiments described above with reference to FIGS. 3A-3D, two bridges are provided in the illustrative BAW resonator devices 300A-300D. One bridge is provided in the acoustic reflector and another bridge is provided in the resonator stack in each embodiment. The bridges are generally concentric, although not necessarily circular in shape, and are disposed about a perimeter that encloses the active region of the BAW resonator device 300A-300D. Notably, by placing the bridges under different combinations of layers, the various embodiments can be studied to test the degree of coupling of modes in the active region and the modes in the field region. Generally, the bridge decouples modes with a comparatively large propagation constant $k_r$ from the modes in the field region. As described below, the various embodiments comprise combinations of "filled" and "unfilled" bridges.

Figure 4:
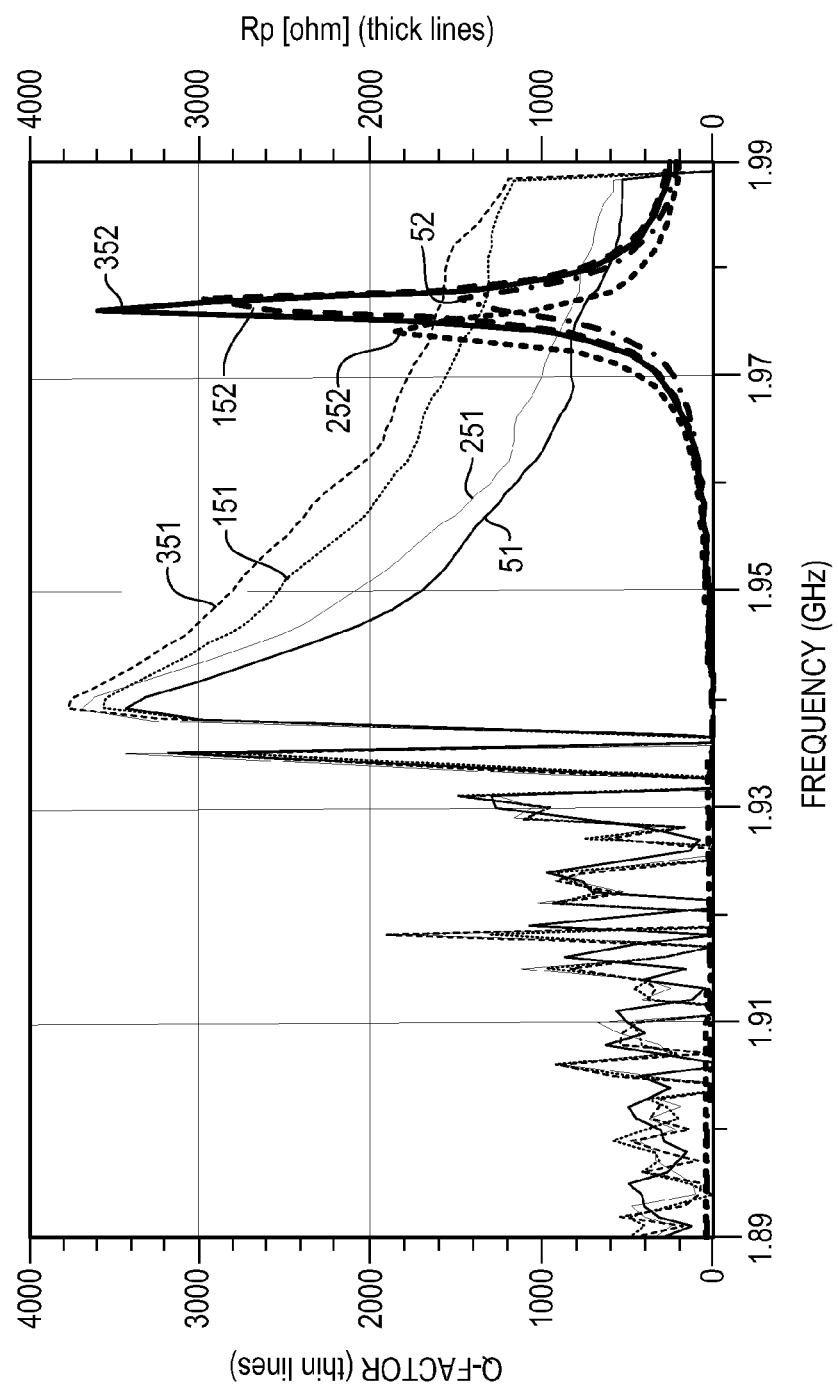
FIG. 4 provides graphical comparisons of quality factor Q/parallel resistance Rp of a conventional BAW resonator device and BAW resonator devices in accordance with representative embodiments.

FIG. 4 provides graphical comparisons of quality factor Q/parallel resistance Rp of a conventional BAW resonator device and BAW resonator devices in accordance with representative embodiments.

FIG. 4 shows comparisons of simulated quality factor Q and parallel resistance Rp versus frequency of a conventional BAW resonator device (without bridges) and the BAW resonator devices 100, 200 and 300 of the representative embodiments, discussed above. For purposes of illustration of the improvement in mode confinement in the active region 114 of each of the BAW resonator devices 100, 200 and 300 in FIG. 4, each bridge 104, 204, 301 and 302 has a width (x-dimension) of approximately 5.0 μm, a height of 1500 Å, and coupling region 113 of approximately 2.0 μm. In addition, with reference to the acoustic reflector 120, each of the odd acoustic impedance layers 121, 123 and 125 has a height of approximately 8600 Å and is formed of $SiO_x$, and each of the even acoustic impedance layers 122, 124 and 126 has a height of approximately 4700 Å and is formed of W. With reference to the resonator stack 110, each of the bottom and top electrodes 107 and 101 has a height of approximately 2400 Å and is formed of W, and the piezoelectric layer 108 has a height of approximately 10000 Å and is formed of AlN. A planarization layer 107' having a height of approximately 2400 Å and formed of NEBSG is also included in the resonator stack 110. The acoustic reflector 120 and the resonator stack 110 are stacked on the substrate 105 formed of Si. Of course, the various dimensions and materials are not limited to this example.

Curve 51 depicts the quality factor Q of a conventional BAW resonator device (without any bridges). Curve 151 depicts the quality factor Q of BAW resonator device 100 (with unfilled bridge 104 between the bottom electrode 107 and the piezoelectric layer 108); curve 251 depicts the quality factor Q of BAW resonator device 200 (with unfilled bridge 204 between the first and second acoustic impedance layer 121 and 122); and curve 351 depicts the quality factor Q of BAW resonator device 300 (with unfilled bridge 301 between the first and second acoustic impedance layer 121 and 122 and unfilled bridge 302 between the bottom electrode 107 and the piezoelectric layer 108). The corresponding values of the quality factor Q are shown on the left vertical axis. Compared to the conventional BAW resonator device, the quality factor Q increases for each of the BAW resonator devices 100, 200 and 300. The greatest increase is shown by curve 351. For example, at about 1.94 GHz, curve 51 shows a quality factor Q of about 3400, where the quality factor Q is a ratio of energy stored to energy lost in one cycle, while curves 251, 151 and 351 show quality factors Q of about 3600, 3700 and 3800, respectively.

Similarly, curve 52 depicts the parallel resistance Rp of a conventional BAW resonator device (without any bridges). Curve 251 depicts the parallel resistance Rp of BAW resonator device 100; curve 252 depicts the parallel resistance Rp of BAW resonator device 200; and curve 351 depicts the parallel resistance Rp of BAW resonator device 300. The corresponding values of the parallel resistance Rp are shown on the right vertical axis. Compared to the conventional BAW resonator device, the parallel resistance Rp increases for each of the BAW resonator devices 100, 200 and 300. The greatest increase is shown by curve 352. For example, at about 1.977 GHz, curve 52 shows a peak parallel resistance Rp of about 1500 ohms, while curve 252 shows a peak parallel resistance Rp of about 1800 ohms at about 1.973 GHz, curve 152 shows a peak parallel resistance Rp of about 3000 ohms at about 1.977 GHz, and curve 352 shows a peak parallel resistance Rp of about 3500 ohms at about 1.975 GHz.

Figure 5A:
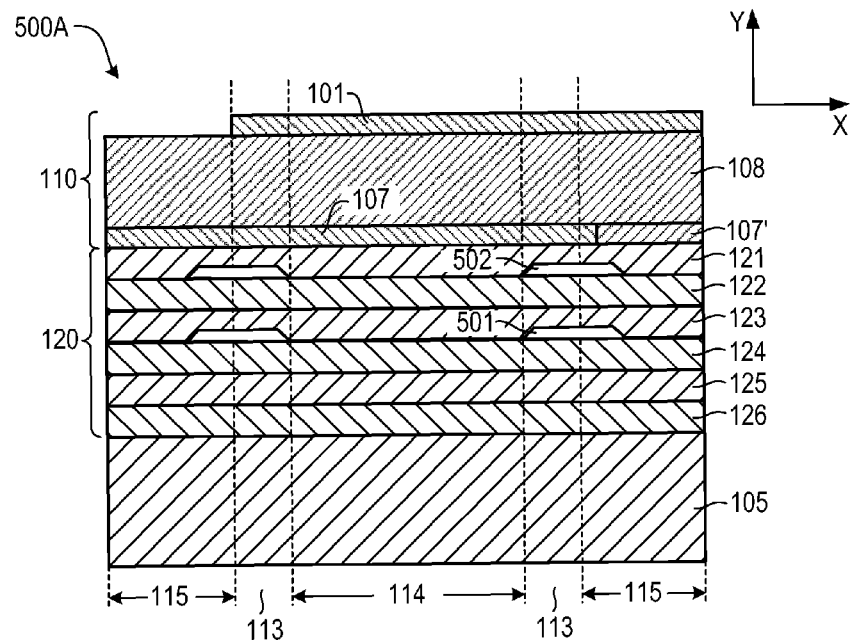
FIGS. 5A-5B are cross-sectional views of a BAW resonator device having multiple bridges in layers of an acoustic reflector in accordance with representative embodiments.
Figure 5B:
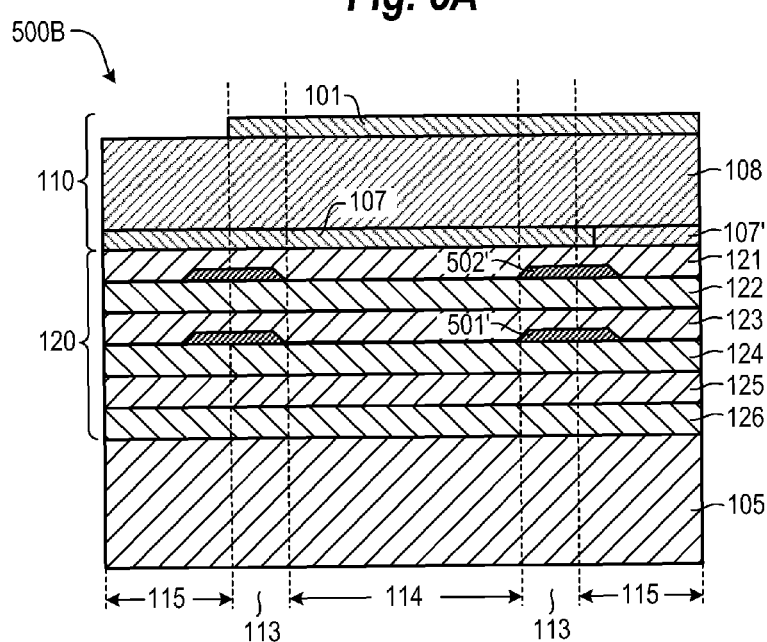
Figure 6A:
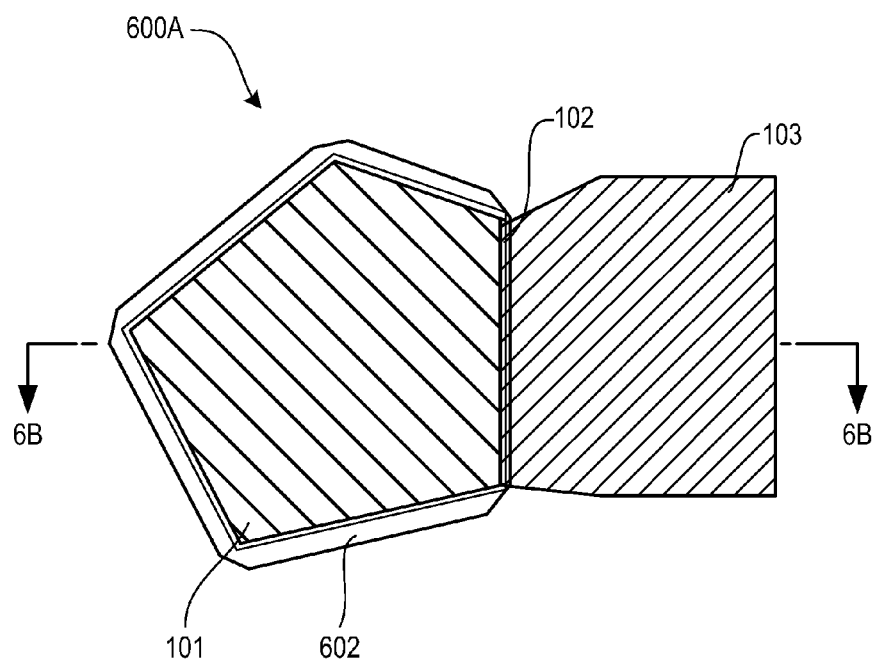
FIG. 6A shows a top-view of a BAW resonator device having an acoustic reflector and multiple bridges in layers of a resonator stack in accordance with a representative embodiment.
Figure 6B:
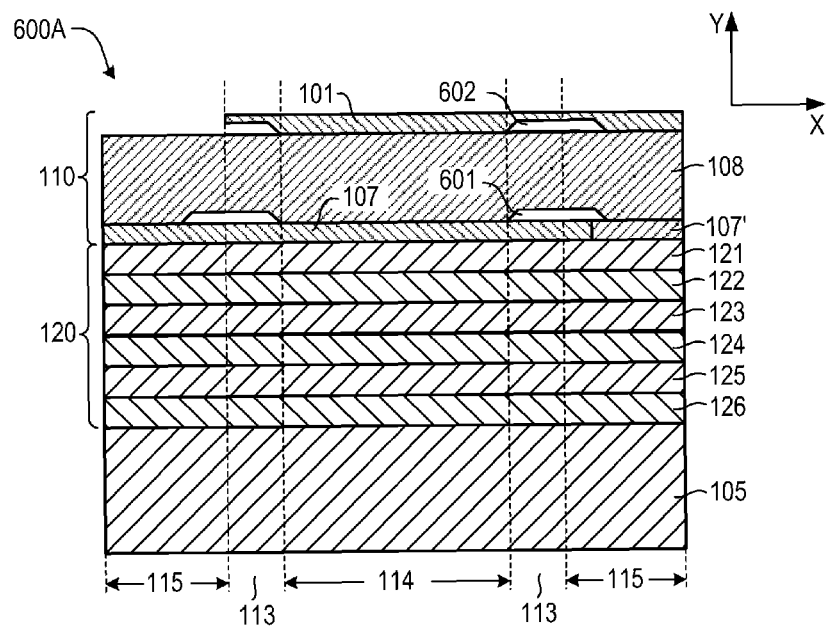
FIGS. 6B-6C are cross-sectional views of the BAW resonator devices taken along line 6B-6B of FIG. 6A, having an acoustic reflector and multiple bridges in layers of a resonator stack in accordance with representative embodiments.
Figure 6C:
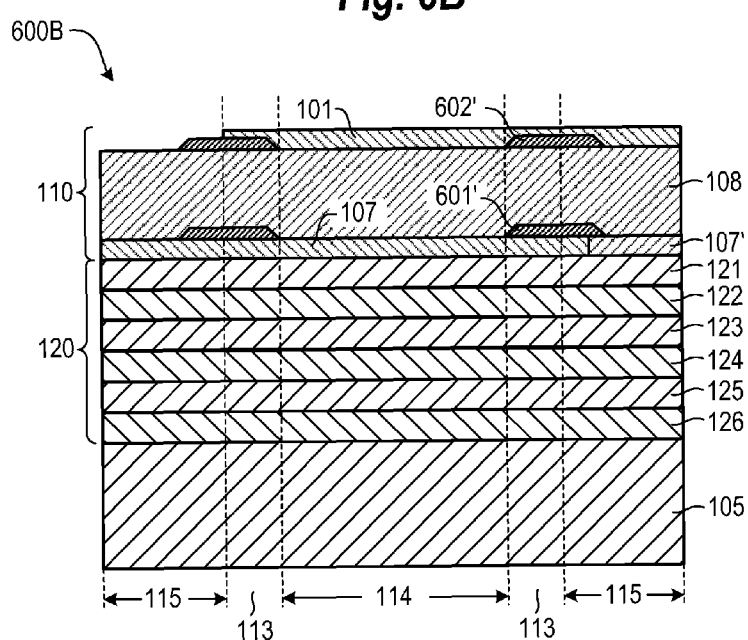

In the embodiments described above with reference to FIGS. 3A-3D, the representative BAW resonator devices include multiple bridges, where one bridge is located in the acoustic reflector (between the first and second acoustic impedance layers) and the other bridge is located in the resonator stack (between the bottom electrode and piezoelectric layer). However, in alternative embodiments, both bridges (as well as additional bridges) may all be included in the acoustic reflector or in the resonator stack a BAW resonator device, without departing from the scope of the present teachings. For example, FIGS. 5A-5B are cross-sectional views of BAW resonator devices which have multiple bridges between layers the acoustic reflector, and FIGS. 6A-6C are top/cross-sectional views of BAW resonator devices which have multiple bridges between layers of the resonator stack, in accordance with representative embodiments. Notably, the effectiveness of using multiple bridges in the acoustic reflector for improving quality factor Q generally depends on acoustic impedance contrast between adjacent acoustic impedance layers 121 through 126. When the acoustic impedance contrast is relatively large, then most of the acoustic energy is confined to the top one or two layers (e.g., first and second acoustic impedance layers 121 and 122) of the acoustic reflector 120. In such cases, the embodiments described above with reference to FIGS. 2A-3D should provide sufficiently large improvement to quality factor Q. However, when the acoustic impedance contrast is relatively small, then a significant portion of the acoustic energy is distributed across several layers of the acoustic reflector 120. In such cases, the embodiments described above with reference to FIGS. 5A-5B comprising of multiple bridges in acoustic reflector 120 may be needed to provide improvement in quality factor Q.

Referring to FIG. 5A, BAW resonator device 500A includes resonator stack 110, acoustic reflector 120 and substrate 105. The resonator stack 110 includes piezoelectric layer 108 sandwiched between bottom electrode 107 and top electrode 101, as discussed above. The acoustic reflector 120 may be a DBR or other acoustic mirror, for example, formed of multiple acoustic impedance layers 121 to 126. The resonator stack 110 and the acoustic reflector 120 are substantially the same as described above (with the exception of bridge location), and therefore the corresponding descriptions will not necessarily be repeated. Further, the general purpose and functionality of the bridges are substantially the same as described above with reference to FIGS. 1A through 3D, and therefore the corresponding descriptions are not necessarily repeated.

In the depicted embodiment, first bridge 501 is buried between the third and fourth acoustic impedance layers 123 and 124, and second bridge 502 is buried between the first and second acoustic impedance layers 121 and 122 of BAW resonator device 500A. Both the first bridge 501 and the second bridge 502 are unfilled (i.e., contain air). The first and second bridges 501, 502 are disposed along the perimeter of the active region 114 of the BAW resonator device 500A, and foster confinement and suppression of eigen-modes in the active region 114 of the of BAW resonator device 500A. For purposes of illustration, the first and second bridges 501, 502 have dimensions substantially the same as bridges 301, 302, discussed above. Similar improvements in the quality factor Q and parallel resistance Rp are expected.

FIG. 5B shows first bridge 501' buried between the third and fourth acoustic impedance layers 123 and 124, and second bridge 502' buried between the first and second acoustic impedance layers 121 and 122 of BAW resonator device 500B. Each of the first and second bridges 501', 502' is filled (e.g., filled with NEBSG or other fill material). The first and second bridges 501', 502' are disposed around the perimeter of the active region 114 of the BAW resonator device 500B, and foster confinement and suppression of eigen-modes in the active region 114 of the of BAW resonator device 500B. Similar improvements in the quality factor Q and parallel resistance Rp are expected. Beneficially, the use of filled bridges provides a more rugged structure than the use of unfilled bridges.

In various additional embodiments (not shown), one bridge within the acoustic resonator 120 may be unfilled (501 or 502) while the other bridge may be filled (501' or 502'). In addition, more than two bridges (unfiled and/or filled) may be formed within the acoustic resonator 120, without departing from the scope of the present teachings. Also, in alternative embodiments, an unfilled or filled bridge may be buried within one or more layers of the acoustic reflector 120, without departing from the scope of the present teachings. For example, an unfilled or filled bridge may be formed entirely within the first acoustic isolation layer 122. An example of forming an unfilled or filled bridge (e.g., in a piezoelectric layer) is described for example in commonly owned U.S. patent application Ser. No. 13/208,909 to Burak et al., filed on Aug. 12, 2011, which is hereby incorporated by reference in its entirety.

FIG. 6A shows a top-view of a BAW resonator device 600A having an acoustic reflector and multiple bridges in layers of a resonator stack in accordance with a representative embodiment. Similar to the BAW resonator device 100A shown in FIG. 1A, the BAW resonator device 600A includes the top electrode 101 having five (5) sides, with the connection side 102 configured to provide an electrical connection to the interconnect 103. The interconnect 103 provides electrical signals to the top electrode 101 to excite desired acoustic waves in a piezoelectric layer (not shown in FIG. 6A) of the BAW resonator device 600A. In addition, the top electrode 101 includes a second bridge 602 disposed on all sides (the bridge on the connection side 102 cannot be seen in the top view of FIG. 6A). Providing the second bridge 602 about the perimeter of the BAW resonator device 600A contributes to improved insertion loss and the Q-factor over a desired frequency range (e.g., a passband of the BAW resonator device 600A).

FIG. 6B shows a cross-sectional view of the BAW resonator device 600A taken along line 6B-6B in accordance with a representative embodiment. Referring to FIG. 6B, the BAW resonator device 600A includes resonator stack 110, acoustic reflector 120 and substrate 105. The resonator stack 110 includes piezoelectric layer 108 sandwiched between bottom electrode 107 and top electrode 101, as discussed above. The acoustic reflector 120 may be a DBR or other acoustic mirror, for example, formed of multiple acoustic impedance layers 121 to 126. The resonator stack 110 and the acoustic reflector 120 are substantially the same as described above (with the exception of bridge location), and therefore the corresponding descriptions will not necessarily be repeated. Further, the general purpose and functionality of the bridges are substantially the same as described above with reference to FIGS. 1A through 3D, and therefore the corresponding descriptions are not necessarily repeated.

In the depicted embodiment, first bridge 601 is buried between bottom electrode 107 and piezoelectric layer 108, and the second bridge 602 is buried between the piezoelectric layer 108 and top electrode 101. Both the first bridge 601 and the second bridge 602 are unfilled (i.e., contain air). The first and second bridges 601, 602 are disposed along the perimeter of the active region 114 of the BAW resonator device 600A, and foster confinement and suppression of eigen-modes in the active region 114 of the of BAW resonator device 600A. Notably, the width of second bridge 602 is shortened (on the left side of FIG. 6B) where the top electrode 101 ends. Thus, the unfilled second bridge 602 may be referred to as a wing or cantilever. Wings/cantilevers and formation thereof are described, for example, in U.S. Patent App. Pub. No. 2010/0327994 to Choy et al., published Dec. 30, 2010, which is hereby incorporated by reference in its entirety. For purposes of illustration, the first and second bridges 601, 602 have dimensions substantially the same as bridges 301, 302, discussed above. Similar improvements in the quality factor Q and parallel resistance Rp are expected.

FIG. 6C shows first bridge 601' buried between bottom electrode 107 and piezoelectric layer 108, and second bridge 602' buried between the piezoelectric layer 108 and top electrode 101 of BAW resonator device 600B. Each of the first and second bridges 601', 602' is filled (e.g., filled with NEBSG or other fill material). The first and second bridges 601', 602' are disposed around the perimeter of the active region 114 of the BAW resonator device 600B, and foster confinement and suppression of eigen-modes in the active region 114 of the of BAW resonator device 600B. Similar improvements in the quality factor Q and parallel resistance Rp are expected. Beneficially, the use of filled bridges provides a more rugged structure than the use of unfilled bridges.

In various additional embodiments (not shown), one bridge within the resonator stack 110 may be unfilled (601 or 602) while the other bridge may be filled (601' or 602'). In addition, more than two bridges (unfilled and/or filled) may be formed within the resonator stack 110, without departing from the scope of the present teachings. Also, in alternative embodiments, an unfilled or filled bridge may be buried within one or more layers of the resonator stack 110, without departing from the scope of the present teachings. For example, an unfilled or filled bridge may be formed entirely within the piezoelectric layer 108, as described for example in commonly owned U.S. patent application Ser. No. 13/208,909 to Burak et al., filed on Aug. 12, 2011, which is hereby incorporated by reference in its entirety.

Each of the BAW resonator devices discussed above with reference to FIGS. 1A-3D and 5A-6C may include various additional features without departing from the scope of the present teachings. For example, an inner raised region and/or an outer raised region may be included on a top surface of the top electrode (e.g., top electrode 101) in the active region of the BAW resonator device (e.g., active region 114). The inner raised region may be separated from the edges of the active region or from an inner edge of the outer raised region by a gap. Details of such inner and outer raised regions, including illustrative thickness and width dimensions of the inner and outer raised regions, as well as widths of corresponding gaps, are described in commonly owned U.S. Patent Application Pub. No. 2012/0248941, to Shirakawa et al., entitled "Stacked Bulk Acoustic Resonator and Method of Fabricating Same," published on Oct. 4, 2012, which is hereby incorporated by reference in its entirety. The combination of the bridges, the inner raised region and/or the outer raised regions further improves mode confinement and suppression in the active region (e.g., active region 114) of the representative BAW resonator devices.

In alternative embodiments, unfilled or filled bridges may be formed between any two adjacent layers or within a single layer of various other types of resonator devices, without departing from the scope of the present teachings. For example, an unfilled or filled bridge may be formed between or within layers of a stacked bulk acoustic resonator (SBAR) device, a double bulk acoustic resonator (DBAR) device, or a coupled resonator filter (CRF) device, which include acoustic reflectors (e.g., in place of cavities). Examples of various alternative types of resonator devices, including unfilled or filled bridges, are provided in commonly owned U.S. Patent Application Pub. No. 2012/0218056 to Burak, published Aug. 30, 2012, and U.S. Patent Application Pub. No. 2012/0218055 to Burak et al., published on Aug. 30, 2012, which are hereby incorporated by reference in their entireties.

In accordance with illustrative embodiments, BAW resonator structures comprising bridges and their methods of fabrication are described. One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator device, comprising:
   an acoustic reflector formed over a substrate, the acoustic reflector comprising a plurality of acoustic impedance layers;
   a resonator stack formed over the acoustic reflector, the resonator stack comprising a bottom electrode formed over the acoustic reflector, a piezoelectric layer formed over the bottom electrode, and a top electrode formed over the piezoelectric layer;
   a first bridge formed in the acoustic reflector; and
   a second bridge formed in the resonator stack.

2. The BAW resonator device of claim 1, wherein the first bridge is formed between adjacent acoustic impedance layers of the acoustic reflector.

3. The BAW resonator device of claim 2, wherein the first bridge is formed between a first acoustic impedance layer adjacent the bottom electrode and a second acoustic impedance layer formed adjacent the first acoustic impedance layer.

4. The BAW resonator device of claim 3, wherein the first acoustic impedance layer is formed of a first material having a relatively low acoustic impedance and the second acoustic impedance layer is formed of a second material having a relatively high acoustic impedance.

5. The BAW resonator device of claim 4, wherein the first material comprises one of silicon oxide ($SiO_x$) or carbon-doped silicon oxide (CDO), and the second material comprises one of tungsten (W), molybdenum (Mo) or silicon nitride ($SiN_x$).

6. The BAW resonator device of claim 1, wherein the acoustic reflector comprises a distributed Bragg reflector (DBR).

7. The BAW resonator device of claim 1, wherein the first bridge is formed between a first acoustic impedance layer adjacent the bottom electrode and a second acoustic impedance layer formed adjacent the first acoustic impedance layer.

8. The BAW resonator device of claim 7, wherein the second bridge is formed between the bottom electrode and the piezoelectric layer.

9. The BAW resonator device of claim 1, wherein the first bridge comprises an unfilled bridge, containing air.

10. The BAW resonator device of claim 1, wherein the first bridge comprises a filled bridge, containing a dielectric material.

11. The BAW resonator device of claim 10, wherein the dielectric material comprises one of non-etchable borosilicate glass (NEBSG), carbon doped silicon dioxide (CDO), or silicon carbide (SiC).

12. The BAW resonator device of claim 1, wherein the first bridge comprises a filled bridge, containing a metal.

13. The BAW resonator device of claim 1, further comprising:
    an active region having a perimeter, at least a portion of which is formed by at least one of the first bridge and the second bridge.

14. The BAW resonator device of claim 13, wherein the at least a portion of the perimeter of the active region is formed by one of the first bridge and the second bridge extending furthest toward a center of the BAW resonator device.

15. A bulk acoustic wave (BAW) resonator device, comprising:
    an acoustic reflector formed over a substrate, the acoustic reflector comprising a plurality of acoustic impedance layers;
    a resonator stack formed over the acoustic reflector, the resonator stack comprising a bottom electrode formed over the acoustic reflector, a piezoelectric layer formed over the bottom electrode, and a top electrode formed over the piezoelectric layer; and a bridge formed within the acoustic reflector, the bridge defining at least part of a perimeter along an active region of the BAW resonator device.

16. The BAW resonator device of claim 15, further comprising another bridge formed within the resonator stack.

17. The BAW resonator device of claim 15, further comprising another bridge formed within the acoustic reflector.

18. The BAW resonator device of claim 15, wherein the plurality of acoustic impedance layers are arranged in pairs, each pair comprising an acoustic impedance layer with a relatively low acoustic impedance and an acoustic impedance layer with a relatively high acoustic impedance, and
wherein the bridge is formed between the acoustic impedance layers of a pair.

19. The BAW resonator device of claim 18, where the bridge comprises a filled bridge, containing a material different from a material of an acoustic impedance layer of the plurality of acoustic impedance layers in which the bridge material is formed.

20. A bulk acoustic wave (BAW) resonator device, comprising:
a distributed Bragg reflector (DBR) formed over a substrate, the DBR comprising a plurality of acoustic impedance layers;
a resonator stack formed over the DBR, the resonator stack comprising a bottom electrode formed over the DBR, a piezoelectric layer formed over the bottom electrode, and a top electrode formed over the piezoelectric layer;
a first bridge formed between adjacent layers of the plurality of acoustic impedance layers of the DBR; and
a second bridge formed between the piezoelectric layer and one of the bottom electrode and the top electrode of the resonator stack.

* * * * *